(12) United States Patent
Sasaki et al.

(10) Patent No.: US 11,665,967 B2
(45) Date of Patent: May 30, 2023

(54) VIBRATION DEVICE

(71) Applicant: TDK CORPORATION, Tokyo (JP)

(72) Inventors: Ryuhei Sasaki, Tokyo (JP); Yoshikazu Shimura, Tokyo (JP); Yoshiki Ohta, Tokyo (JP); Kazushi Tachimoto, Tokyo (JP); Hideya Sakamoto, Tokyo (JP); Tetsuyuki Taniguchi, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 276 days.

(21) Appl. No.: 16/957,241

(22) PCT Filed: Oct. 25, 2018

(86) PCT No.: PCT/JP2018/039671
§ 371 (c)(1),
(2) Date: Jun. 23, 2020

(87) PCT Pub. No.: WO2019/130773
PCT Pub. Date: Jul. 4, 2019

(65) Prior Publication Data
US 2021/0384409 A1 Dec. 9, 2021

(30) Foreign Application Priority Data
Dec. 27, 2017 (JP) .............................. JP2017-250730

(51) Int. Cl.
*H01L 41/09* (2006.01)
(52) U.S. Cl.
CPC ......... *H10N 30/2047* (2023.02); *H10N 30/50* (2023.02)

(58) Field of Classification Search
CPC . H01L 41/0973; H01L 41/083; H01L 41/187; H01L 41/00–0536;
(Continued)

(56) References Cited

U.S. PATENT DOCUMENTS 5,176,140 A * 1/1993 Kami ................... B06B 1/0644
600/459
10,760,908 B2 * 9/2020 Nishizawa ......... G01C 19/5656

FOREIGN PATENT DOCUMENTS

| JP | H02-261211 A | 10/1990 |
| JP | H03-017960 U | 2/1991 |
| JP | 2014-102804 A | 6/2014 |

OTHER PUBLICATIONS

Jan. 22, 2019 Search Report issued in International Patent Application No. PCT/JP2018/039671.
(Continued)

*Primary Examiner* — Shahed Ahmed
(74) *Attorney, Agent, or Firm* — Oliff PLC

(57) ABSTRACT

A vibration device includes a piezoelectric vibrator having a piezoelectric element and a diaphragm having a pair of main surfaces facing each other, the piezoelectric element being bonded to the main surface, a vibration member where the piezoelectric vibrator is disposed, and an adhesive member disposed between the diaphragm and the vibration member and bonding the diaphragm and the vibration member. Each of the pair of main surfaces of the diaphragm has a rectangular shape when viewed from a facing direction of the pair of main surfaces, and the adhesive member is disposed in a facing manner on at least a pair of sides of the main surfaces.

5 Claims, 15 Drawing Sheets

(58) Field of Classification Search
CPC . H01L 41/08–1138; H01L 27/20; H03H 9/17; B81C 1/00158; H10N 30/04; H10N 30/073; H10N 30/10516; H10N 30/2023; H10N 30/2048; H10N 30/2047; H10N 30/50

See application file for complete search history.

(56) References Cited

OTHER PUBLICATIONS

Jun. 30, 2020 International Preliminary Reporton Patentability issued in International Patent Application No. PCT/JP2018/039671.

* cited by examiner

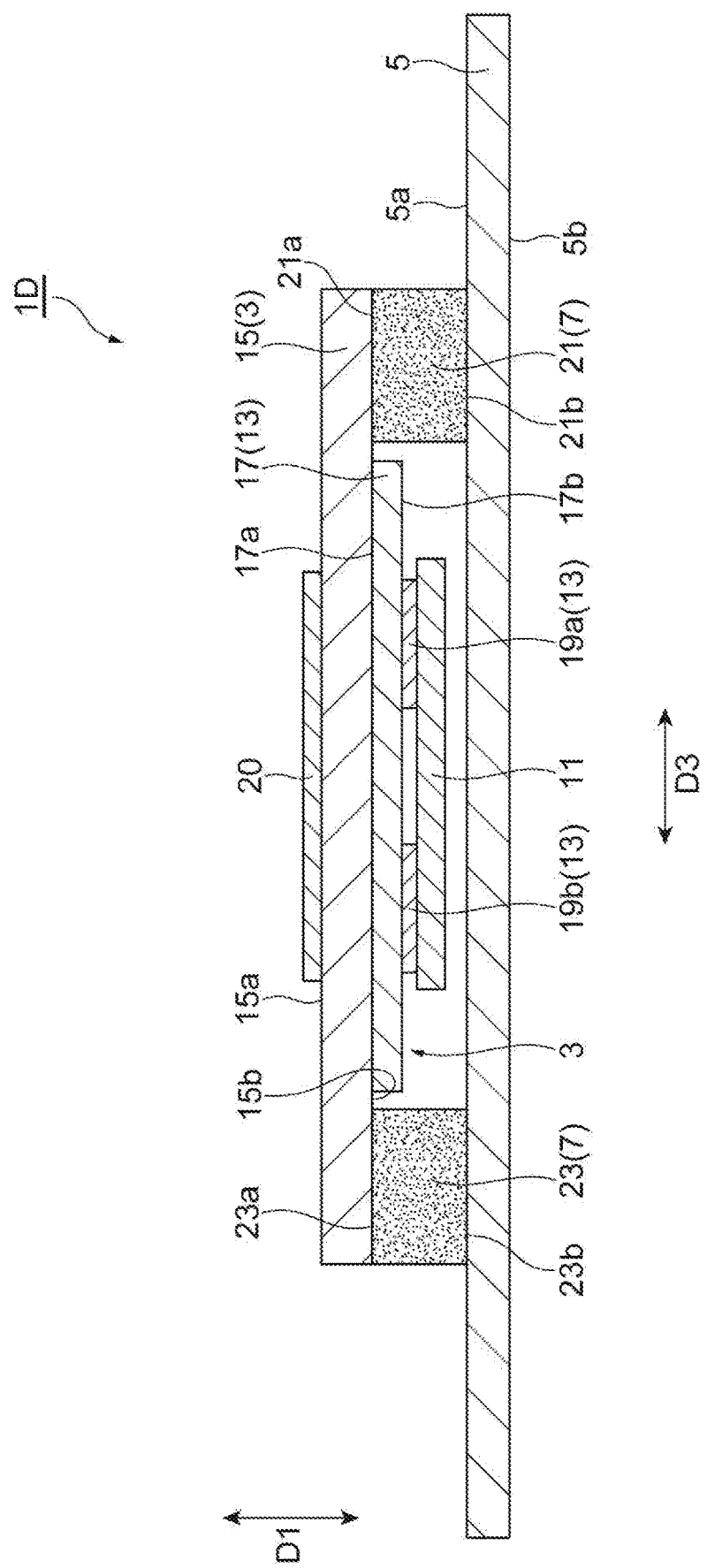

VIBRATION DEVICE

TECHNICAL FIELD

The present invention relates to a vibration device.

BACKGROUND ART

A vibration device known in the related art includes a piezoelectric vibrator having a piezoelectric element and a diaphragm and a vibration member where the piezoelectric vibrator is disposed (see, for example, Patent Literature 1). In the vibration device of the related art, the entire surface of the diaphragm of the piezoelectric vibrator and the vibration member are bonded by an adhesive member.

CITATION LIST

Patent Literature

Patent Literature 1: Japanese Unexamined Patent Publication No. 2014-102804

SUMMARY OF INVENTION

Technical Problem

In a configuration in which the entire surface of a diaphragm and a vibration member are bonded as in the vibration device of the related art, displacement (driving) of a piezoelectric vibrator is hindered by the vibration member. Accordingly, in the vibration device of the related art, displacement of the piezoelectric vibrator can be reduced, and thus vibration cannot be efficiently obtained.

An object of one aspect of the present invention is to provide a vibration device that is capable of efficiently obtaining vibration of a piezoelectric vibrator.

Solution to Problem

A vibration device according to one aspect of the present invention includes a piezoelectric vibrator having a piezoelectric element and a diaphragm having a pair of main surfaces facing each other, the piezoelectric element being bonded to one of the main surfaces, a vibration member where the piezoelectric vibrator is disposed, and an adhesive member disposed between the diaphragm and the vibration member and bonding the diaphragm and the vibration member. Each of the pair of main surfaces of the diaphragm has a rectangular shape when viewed from a facing direction of the pair of main surfaces, and the adhesive member is disposed in a facing manner on at least a pair of sides of the main surface.

In the vibration device according to one aspect of the present invention, the adhesive members are disposed so as to face each other on at least the pair of sides of the main surfaces of the diaphragm. In other words, the diaphragm is held by (fixed to) the vibration member by the adhesive members, which are disposed so as to face each other on at least the pair of sides. In this configuration, a space is formed between the adhesive members facing each other. In other words, a gap is formed between the diaphragm and the vibration member. Accordingly, in the vibration device, it is possible to avoid the vibration member hindering displacement of the piezoelectric vibrator. Accordingly, in the vibration device, vibration of the piezoelectric vibrator can be efficiently obtained.

In one embodiment, end portions of the piezoelectric element on the pair of sides may overlap the adhesive member when viewed from the facing direction. The piezoelectric vibrator is unlikely to be displaced at the part that is bonded to the adhesive members. Accordingly, in the vibration device, it is possible to suppress the occurrence of displacement in the end portion of the piezoelectric element by disposing the end portion of the piezoelectric element so as to overlap the adhesive members. As a result, in the vibration device, it is possible to suppress peeling of the end portion of the piezoelectric element from the diaphragm and the occurrence of cracks in the end portion of the piezoelectric element. Accordingly, it is possible to suppress a decline in reliability in the vibration device.

In one embodiment, a bonding region where the diaphragm and the adhesive member are bonded may be larger than a region where the end portion of the piezoelectric element and the adhesive member overlap when viewed from the facing direction. In this configuration, the bonding region of the diaphragm and the adhesive members becomes large, and thus bonding strength can be ensured between the diaphragm and the adhesive members. Accordingly, in the vibration device, it is possible to suppress the occurrence of inconvenience such as peeling of the diaphragm and the adhesive members. Accordingly, it is possible to suppress a decline in reliability in the vibration device.

In one embodiment, the piezoelectric element may have a rectangular shape when viewed from the facing direction, the piezoelectric element and the diaphragm may be disposed so as to have following long and short sides, and a part that is ½ or more of a length of a side of the piezoelectric element along the pair of sides of the diaphragm may overlap the adhesive member in the end portion of the piezoelectric element. In this configuration, it is possible to further suppress the occurrence of displacement in the end portion of the piezoelectric element. As a result, in the vibration device, it is possible to further suppress peeling of the end portion of the piezoelectric element from the diaphragm and the occurrence of cracks in the end portion of the piezoelectric element.

In one embodiment, the vibration device may include a load member disposed on the other main surface of the diaphragm on a side opposite to the main surface to which the piezoelectric element is bonded. When the piezoelectric element is driven in this configuration, the energy for moving the center of gravity of the piezoelectric vibrator can be increased by the load member (excitation can be performed), and thus vibration of the piezoelectric vibrator can be amplified.

Advantageous Effects of Invention

According to one aspect of the present invention, vibration of a piezoelectric vibrator can be efficiently obtained.

BRIEF DESCRIPTION OF DRAWINGS

FIG. 15 is a diagram illustrating a cross-sectional configuration of a vibration device according to a modification example.

DESCRIPTION OF EMBODIMENTS

Figure 1:
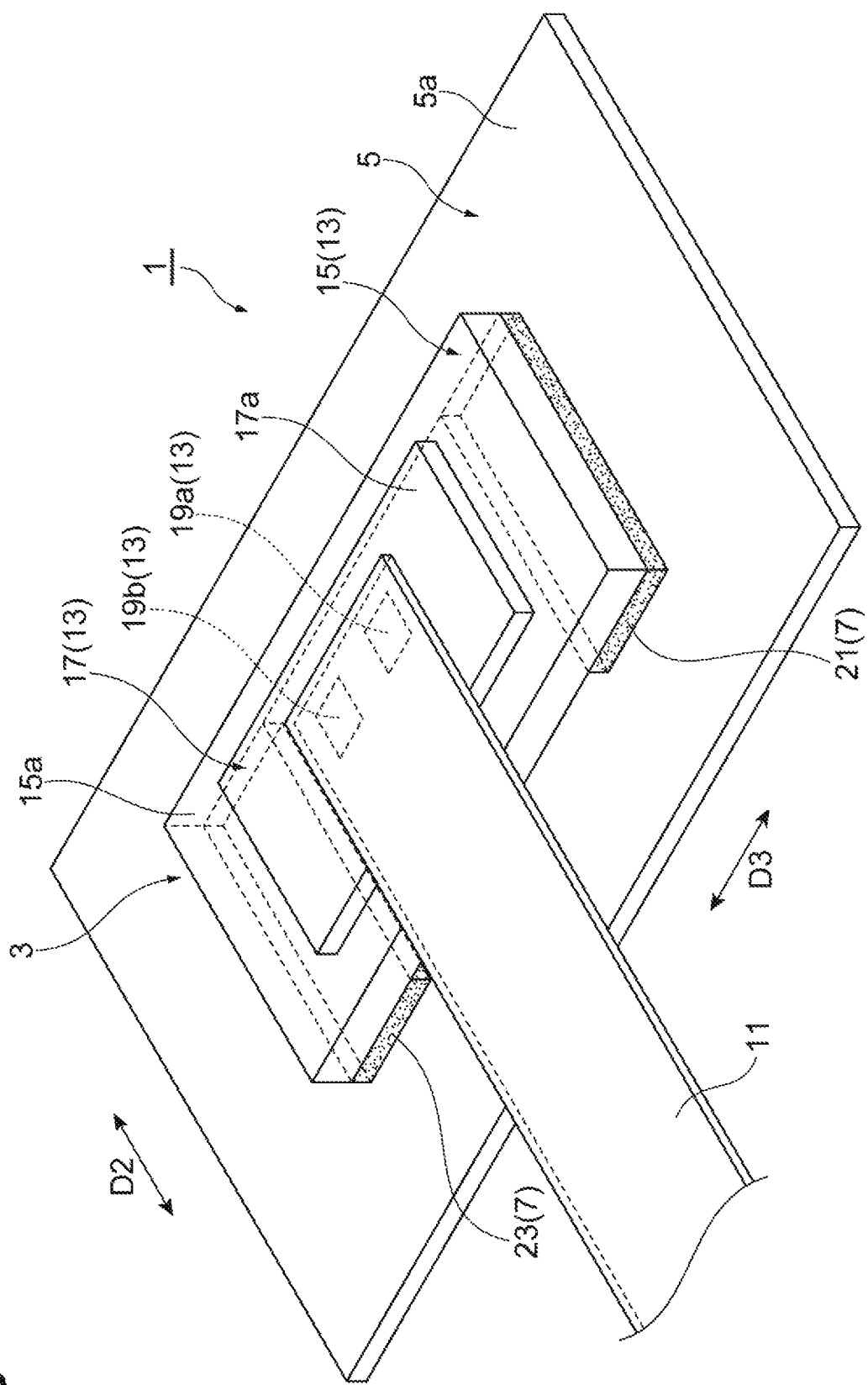
FIG. 1 is a perspective view illustrating a vibration device according to a first embodiment.

Hereinafter, preferred embodiments of the present invention will be described in detail with reference to the accompanying drawings. It should be noted that the same or corresponding elements will be denoted by the same reference symbols, without redundant description, in the description of the drawings.

First Embodiment

As illustrated in FIGS. 1 to 4, a vibration device 1 according to a first embodiment includes a piezoelectric vibrator 3, a vibration member 5, an adhesive member 7, and a wiring member 11.

The piezoelectric vibrator 3 has a piezoelectric element 13 and a diaphragm 15. The piezoelectric element 13 has a piezoelectric element body 17 and a plurality of external electrodes 19a and 19b. In the present embodiment, the piezoelectric element 13 has two external electrodes 19a and 19b.

The piezoelectric element body 17 has a rectangular parallelepiped shape. The piezoelectric element body 17 has a pair of main surfaces 17a and 17b facing each other. The direction in which the pair of main surfaces 17a and 17b face each other is a first direction D1 (see FIGS. 3 and 4). The first direction D1 is also a direction orthogonal to the main surfaces 17a and 17b.

Figure 2:
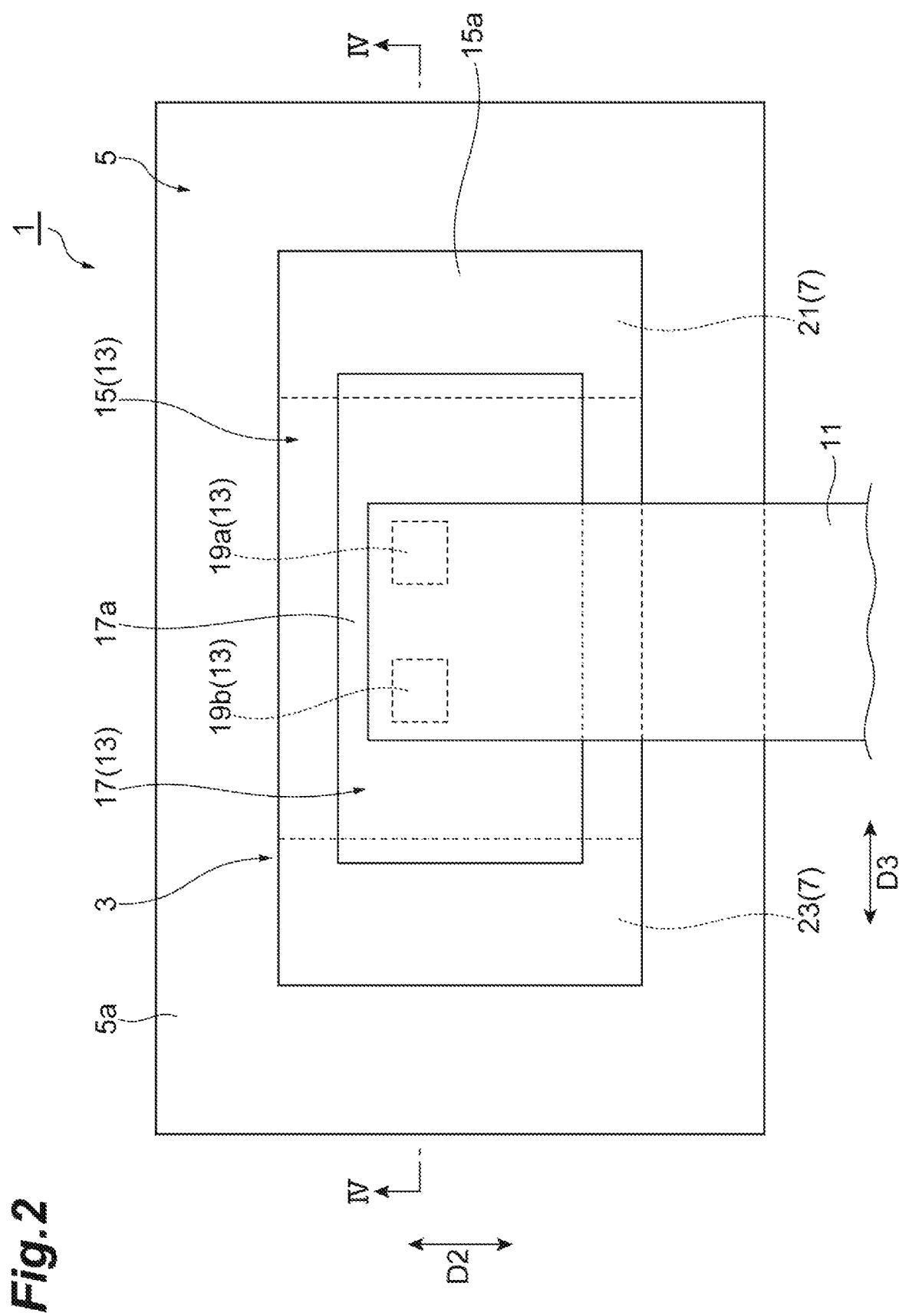
FIG. 2 is a plan view of the vibration device illustrated in FIG. 1.
Figure 3:
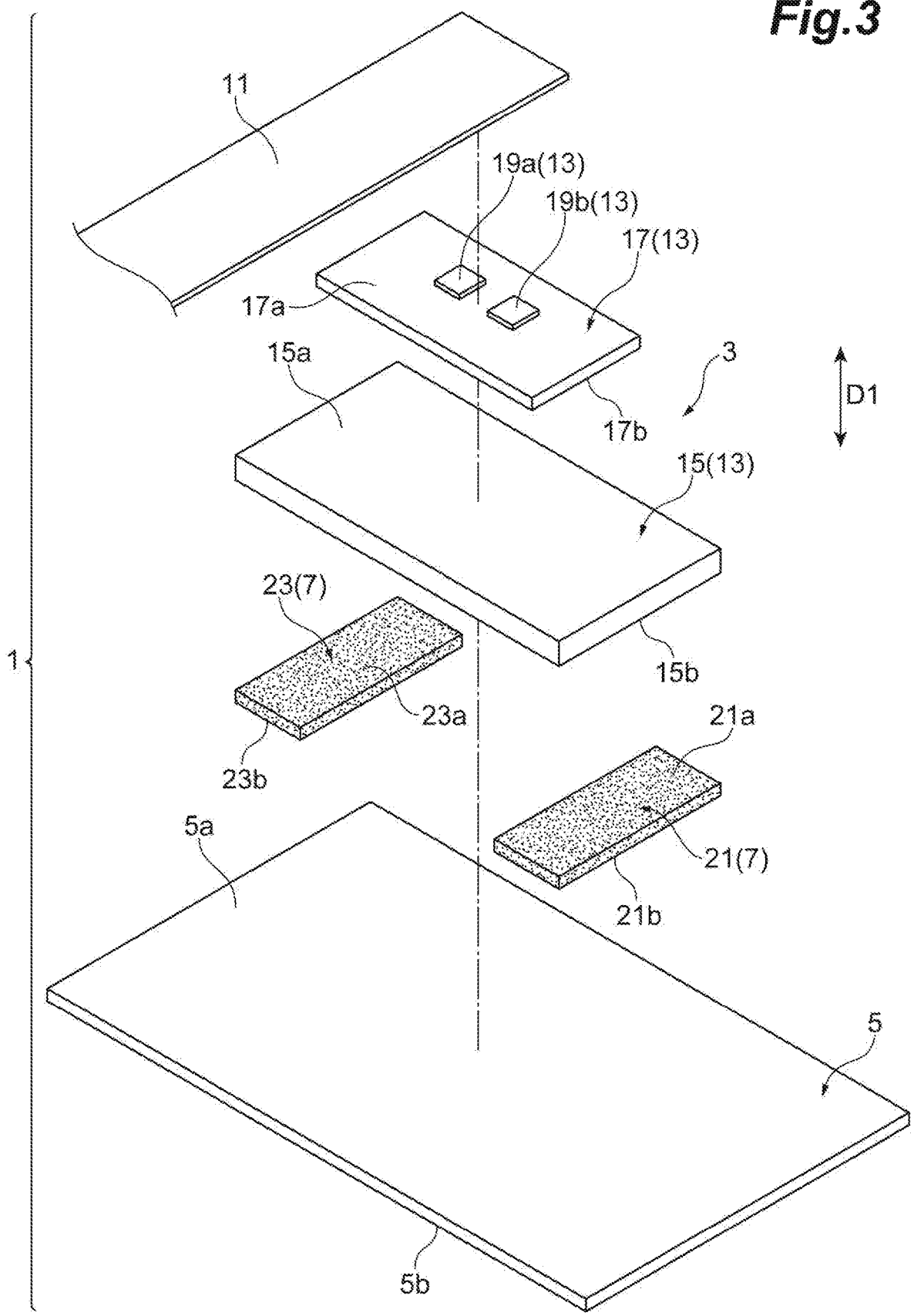
FIG. 3 is an exploded perspective view of the vibration device illustrated in FIG. 1.

As illustrated in FIG. 2, each of the main surfaces 17a and 17b has a pair of long sides and a pair of short sides. Each of the main surfaces 17a and 17b has a rectangular shape having a pair of long sides and a pair of short sides. In other words, the piezoelectric element 13 (piezoelectric element body 17) has a rectangular shape having a pair of long sides and a pair of short sides in plan view. The rectangular shape includes, for example, a shape in which each corner is chamfered and a shape in which each corner is rounded. In the present embodiment, the short side direction of the main surfaces 17a and 17b is a second direction D2. The long side direction of the main surfaces 17a and 17b is a third direction D3.

The piezoelectric element body 17 is configured by a plurality of piezoelectric layers (not illustrated) being laminated. Each piezoelectric layer is formed of a piezoelectric material. In the present embodiment, each piezoelectric layer is formed of a piezoelectric ceramic material. PZT [Pb(Zr,Ti)O$_3$], PT (PbTiO$_3$), PLZT [(Pb,La)(Zr,Ti)O$_3$], barium titanate (BaTiO$_3$), or the like is used as the piezoelectric ceramic material. Each piezoelectric layer is made of, for example, a sintered body of a ceramic green sheet containing the above-described piezoelectric ceramic material. In the actual piezoelectric element body 17, each piezoelectric layer is integrated to the extent that the boundaries between the piezoelectric layers are unrecognizable. A plurality of internal electrodes (not illustrated) are disposed in the piezoelectric element body 17. Each internal electrode is formed of a conductive material. Ag, Pd, an Ag—Pd alloy, or the like is used as the conductive material.

Each of the external electrodes 19a and 19b is disposed on the main surface 17a. The external electrode 19a and the external electrode 19b are arranged in the third direction D3. The external electrode 19a and the external electrode 19b are adjacent to each other in the third direction D3. Each of the external electrodes 19a and 19b is separated from every edge (the four sides) of the main surface 17a when viewed from the first direction D1. Each of the external electrodes 19a and 19b has a rectangular shape when viewed from the first direction D1. The rectangular shape also includes, for example, a shape in which each corner is chamfered and a shape in which each corner is rounded. Each of the external electrodes 19a and 19b is formed of a conductive material. Ag, Pd, an Ag—Pd alloy, or the like is used as the conductive material. Each of the external electrodes 19a and 19b is configured as, for example, a sintered body of conductive paste containing the above-described conductive material.

The diaphragm 15 is a plate-shaped member. The diaphragm 15 is formed of, for example, metal. The diaphragm 15 is formed of, for example, a Ni alloy or stainless steel. The diaphragm 15 has a pair of main surfaces 15a and 15b facing each other. The diaphragm 15 has a pair of long sides and a pair of short sides. Each of the main surfaces 17a and 17b has a rectangular shape having a pair of long sides and a pair of short sides. In other words, the diaphragm 15 has a rectangular shape having a pair of long sides and a pair of short sides in plan view. In the present embodiment, the long side direction of the main surfaces 15a and 15b coincides with the third direction D3. The short side direction of the main surfaces 15a and 15b coincides with the second direction D2 direction.

The pair of long sides of the main surfaces 15a and 15b of the diaphragm 15 are longer than the pair of long sides of the main surfaces 17a and 17b of the piezoelectric element body 17. The pair of short sides of the main surfaces 15a and 15b of the diaphragm 15 are longer than the pair of short sides of the main surfaces 17a and 17b of the piezoelectric element body 17. In other words, the diaphragm 15 is larger in area (outer shape) than the piezoelectric element body 17 when viewed from the first direction D1.

The piezoelectric element 13 is disposed on the diaphragm 15. The piezoelectric element 13 is disposed at the middle position of the diaphragm 15, that is, at the intermediate position in the long side direction and the short side direction of the main surfaces 15a and 15b of the diaphragm 15. The piezoelectric element 13 is disposed on the diaphragm 15 such that the center of the piezoelectric element 13 coincides with the center of the diaphragm 15 when viewed from the first direction D1. The diaphragm 15 and the piezoelectric element body 17 are disposed so as to have following short and long sides. The pair of long sides and the pair of short sides of the main surfaces 15a and 15b of the diaphragm 15 are along the pair of long sides and the pair of short sides of the main surfaces 17a and 17b of the piezoelectric element body 17.

The diaphragm 15 and the piezoelectric element body 17 are disposed such that the main surface 15a and the main surface 17b face each other. In other words, the piezoelectric element 13 is disposed on the main surface 15a of the diaphragm 15. The main surface 15a of the diaphragm 15 and the main surface 17b of the piezoelectric element body 17 are bonded. The outer shape of the diaphragm 15 constitutes the outer shape of the piezoelectric vibrator 3. The piezoelectric vibrator 3 has a rectangular shape when viewed from the first direction D1. In other words, the piezoelectric vibrator 3 has a pair of long sides and a pair of short sides.

The vibration member 5 is a plate-shaped member. The vibration member 5 is formed of, for example, metal. The vibration member 5 is formed of, for example, a Ni—Fe alloy, Ni, brass, or stainless steel. The vibration member 5 has a pair of main surfaces 5a and 5b facing each other. Each of the main surfaces 5a and 5b has a pair of long sides and a pair of short sides. Each of the main surfaces 5a and 5b has a rectangular shape having a pair of long sides and a pair of short sides. In other words, the vibration member 5 has a rectangular shape having a pair of long sides and a pair of short sides in plan view. In the present embodiment, the long side direction of the main surfaces 5a and 5b coincides with the third direction D3. The short side direction of the main surfaces 5a and 5b coincides with the second direction D2 direction.

The adhesive member 7 is, for example, a double-sided tape. The adhesive member 7 bonds the vibration member 5 and the piezoelectric vibrator 3 to each other. The adhesive member 7 includes a first adhesive member 21 and a second adhesive member 23.

The first adhesive member 21 has a pair of main surfaces 21a and 21b facing each other. An adhesive layer (not illustrated) is provided on the main surfaces 21a and 21b. Each of the main surfaces 21a and 21b has a pair of long sides and a pair of short sides. Each of the main surfaces 21a and 21b has a rectangular shape having a pair of long sides and a pair of short sides. In other words, the first adhesive member 21 has a rectangular shape having a pair of long sides and a pair of short sides in plan view. In the present embodiment, the long side direction of the main surfaces 21a and 21b coincides with the second direction D2. The short side direction of the main surfaces 21a and 21b coincides with the third direction D3. Each of the entire main surface 21a and the entire main surface 21b is an adhesive surface. In other words, the adhesive surface of the first adhesive member 21 has a rectangular shape.

The length of the long side of each of the main surfaces 21a and 21b is equal to the length of the short side of each of the main surfaces 15a and 15b of the diaphragm 15. The length of the short side of each of the main surfaces 21a and 21b is, for example, ¼ or less of the length of the long side of each of the main surfaces 15a and 15b of the diaphragm 15. The first adhesive member 21 has a predetermined thickness (length in the facing direction of the pair of main surfaces 21a and 21b, for example, approximately 0.5 mm).

The second adhesive member 23 has a pair of main surfaces 23a and 23b facing each other. Each of the main surfaces 23a and 23b has a pair of long sides and a pair of short sides. Each of the main surfaces 23a and 23b has a rectangular shape having a pair of long sides and a pair of short sides. In other words, the second adhesive member 23 has a rectangular shape having a pair of long sides and a pair of short sides in plan view. In the present embodiment, the long side direction of the main surfaces 23a and 23b coincides with the second direction D2. The short side direction of the main surfaces 23a and 23b coincides with the third direction D3 direction. Each of the entire main surface 23a and the entire main surface 23b is an adhesive surface. In other words, the adhesive surface of the second adhesive member 23 has a rectangular shape.

The length of the long side of each of the main surfaces 23a and 23b is equal to the length of the short side of each of the main surfaces 15a and 15b of the diaphragm 15. The length of the short side of each of the main surfaces 23a and 23b is, for example, ¼ or less of the length of the long side of each of the main surfaces 15a and 15b of the diaphragm 15. The second adhesive member 23 has a predetermined thickness (length in the facing direction of the pair of main surfaces 23a and 23b, for example, approximately 0.5 mm).

Each of the first adhesive member 21 and the second adhesive member 23 is disposed between the diaphragm 15 and the vibration member 5. Each of the first adhesive member 21 and the second adhesive member 23 is disposed between the main surface 15b of the diaphragm 15 and the main surface 5a of the vibration member 5. The first adhesive member 21 and the second adhesive member 23 are disposed apart from each other with a predetermined gap in the third direction D3. The first adhesive member 21 and the second adhesive member 23 are disposed so as to face each other in the third direction D3. In other words, the first adhesive member 21 and the second adhesive member 23 are disposed so as to face each other on the pair of short-side sides of each of the main surfaces 15a and 15b of the diaphragm 15. The first adhesive member 21 and the second adhesive member 23 fix the diaphragm 15 (piezoelectric vibrator 3) to the vibration member 5 on the pair of short-side sides of the main surfaces 15a and 15b of the diaphragm 15.

The first adhesive member 21 is disposed in one end portion (end portion on the right side of FIG. 2) of the diaphragm 15 in the third direction D3. In other words, the first adhesive member 21 is disposed in the end portion on one short-side side of the piezoelectric vibrator 3. The main surface 21a of the first adhesive member 21 is bonded to the main surface 15b of the diaphragm 15. The main surface 21b of the first adhesive member 21 is bonded to the main surface 5a of the vibration member 5. The entire main surface 21a of the first adhesive member 21 is bonded to the diaphragm 15. The bonding region of the first adhesive member 21 and the diaphragm 15 has a rectangular shape when viewed from the first direction D1.

The long sides of the main surfaces 21a and 21b are along the short sides of the main surfaces 15a and 15b of the diaphragm 15, and the short sides of the main surfaces 21a and 21b are along the long sides of the main surfaces 15a and 15b of the diaphragm 15. In the present embodiment, one end surface (end surface on the right side of FIG. 4) along the long side of each of the main surfaces 21a and 21b is flush with the end surface that is along the short side of each of the main surfaces 15a and 15b of the diaphragm 15. Both end surfaces (upper and lower end surfaces in FIG. 2) along the short sides of the main surfaces 21a and 21b are respectively flush with both end surfaces along the long sides of the main surfaces 15a and 15b of the diaphragm 15.

The second adhesive member 23 is disposed in the other end portion (end portion on the left side of FIG. 2) of the diaphragm 15 in the third direction D3. In other words, the second adhesive member 23 is disposed in the end portion on the other short-side side of the piezoelectric vibrator 3.

The main surface 23a of the second adhesive member 23 is bonded to the main surface 15b of the diaphragm 15. The main surface 23b of the second adhesive member 23 is bonded to the main surface 5a of the vibration member 5. The entire main surface 23a of the second adhesive member 23 is bonded to the diaphragm 15. In other words, the bonding region of the second adhesive member 23 and the diaphragm 15 has a rectangular shape when viewed from the first direction D1.

The long sides of the main surfaces 23a and 23b are along the short sides of the main surfaces 15a and 15b of the diaphragm 15, and the short sides of the main surfaces 23a and 23b are along the long sides of the main surfaces 15a and 15b of the diaphragm 15. In the present embodiment, the other end surface (end surface on the left side of FIG. 4) along the long side of each of the main surfaces 23a and 23b is flush with the end surface that is along the short side of each of the main surfaces 15a and 15b of the diaphragm 15. Both end surfaces (upper and lower end surfaces in FIG. 2) along the short sides of the main surfaces 23a and 23b are respectively flush with both end surfaces along the long sides of the main surfaces 15a and 15b of the diaphragm 15.

As illustrated in FIG. 2, a part of the piezoelectric element 13 overlaps each of the first adhesive member 21 and the second adhesive member 23 when viewed from the first direction D1. One end portion of the piezoelectric element 13 in the third direction D3 overlaps the first adhesive member 21. The other end portion of the piezoelectric element 13 in the third direction D3 overlaps the second adhesive member 23. In the end portion of the piezoelectric element body 17, a part that is ½ or more of the length of the pair of short sides of each of the main surfaces 17a and 17b overlaps each of the first adhesive member 21 and the second adhesive member 23. In the present embodiment, the entire length part of the pair of short sides of each of the main surfaces 17a and 17b of the piezoelectric element body 17 overlaps each of the first adhesive member 21 and the second adhesive member 23.

When viewed from the first direction D1, the region (area) where the piezoelectric element 13 and the first and second adhesive members 21 and 23 overlap is smaller than the bonding region (overlapping area) of the diaphragm 15 and the first and second adhesive members 21 and 23. In other words, when viewed from the first direction D1, the bonding region of the diaphragm 15 and the first and second adhesive members 21 and 23 is larger than the region where the piezoelectric element 13 and the first and second adhesive members 21 and 23 overlap.

Figure 4:
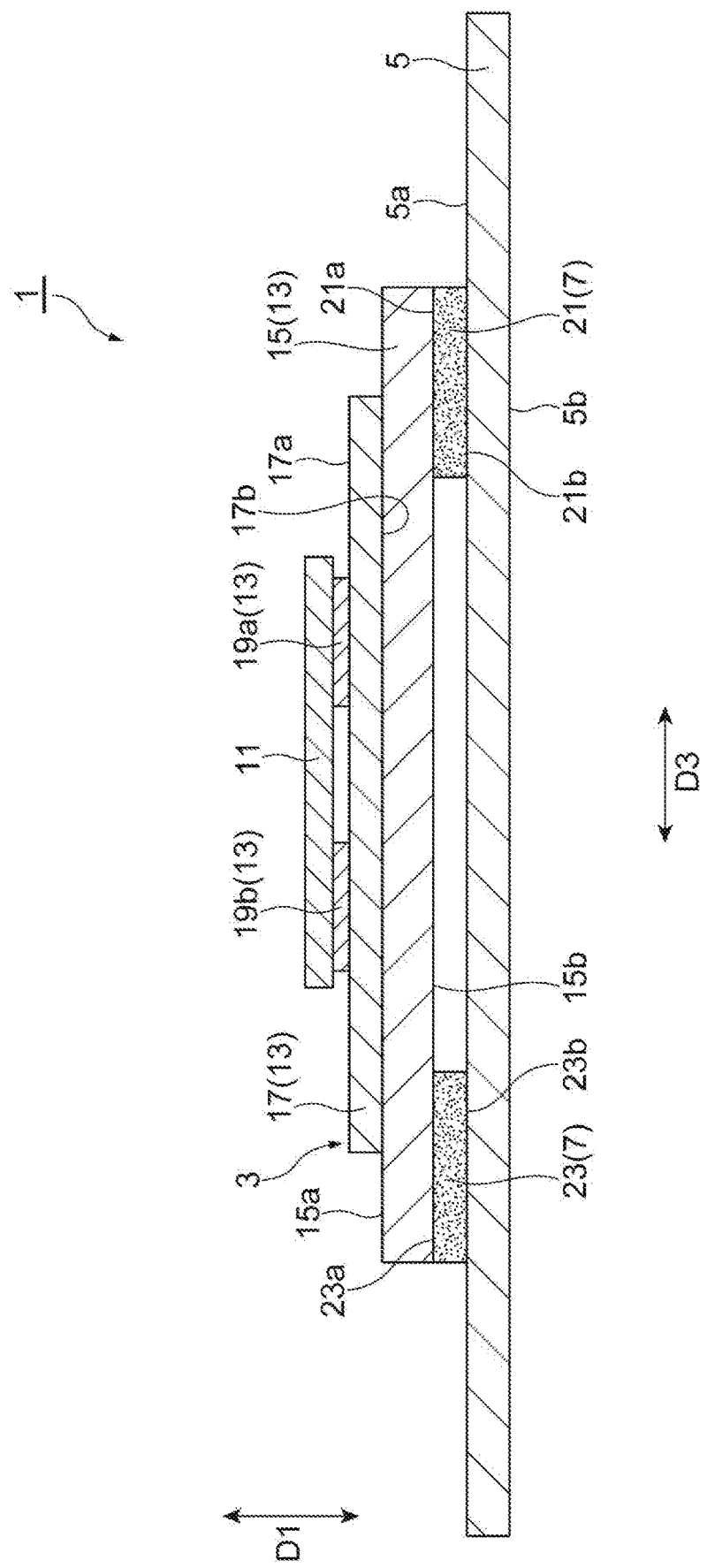
FIG. 4 is a diagram illustrating a cross-sectional configuration along the IV-IV line in FIG. 2.
Figure 5:
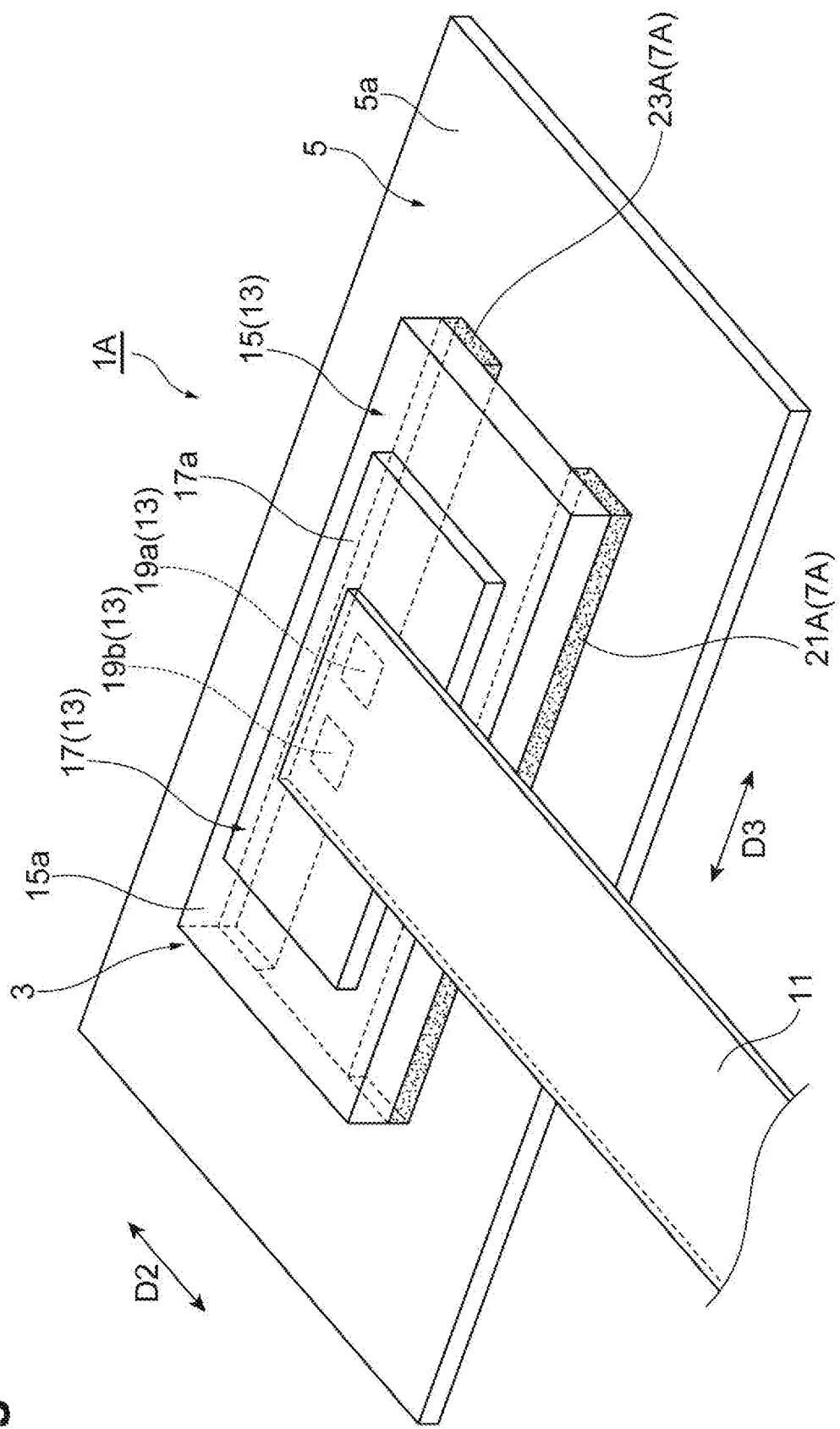
FIG. 5 is a perspective view illustrating a vibration device according to a second embodiment.

As illustrated in FIG. 4, the diaphragm 15 and the vibration member 5 are disposed apart from each other in the first direction D1 by the first adhesive member 21 and the second adhesive member 23. In other words, a gap (space) is formed between the diaphragm 15 and the vibration member 5.

The wiring member 11 is, for example, a flexible printed circuit board (FPC). The wiring member 11 is electrically connected to the external electrodes 19a and 19b of the piezoelectric element 13. The wiring member 11 is disposed so as to intersect with the long sides of the main surfaces 17a and 17b of the piezoelectric element body 17. The direction in which the wiring member 11 extends intersects with the third direction D3. In the present embodiment, the wiring member 11 is disposed so as to be orthogonal to the long sides of the main surfaces 17a and 17b. The direction in which the wiring member 11 extends is orthogonal to the third direction D3. The wiring member 11 extends in the second direction D2. The wiring member 11 has one end portion electrically and physically connected to the piezoelectric element 13 and the other end portion electrically and physically connected to an electronic device (not illustrated) in which the vibration device 1 is mounted.

As described above, in the vibration device 1 according to the present embodiment, the first adhesive member 21 and the second adhesive member 23 are disposed so as to face each other on the short-side sides of the main surfaces 15a and 15b of the diaphragm 15. In other words, the diaphragm 15 is held by (fixed to) the vibration member 5 by the first adhesive member 21 and the second adhesive member 23, which are disposed so as to face each other on the short-side sides of the main surfaces 15a and 15b. In this configuration, a space is formed between the first adhesive member 21 and the second adhesive member 23 facing each other. In other words, a gap is formed between the diaphragm 15 and the vibration member 5. Accordingly, in the vibration device 1, it is possible to avoid the vibration member 5 hindering displacement of the piezoelectric vibrator 3. Accordingly, in the vibration device 1, vibration of the piezoelectric vibrator 3 can be efficiently obtained.

In the vibration device 1 according to the present embodiment, the end portion of the piezoelectric element 13 in the third direction D3 overlaps each of the first adhesive member 21 and the second adhesive member 23 when viewed from the first direction D1. The piezoelectric vibrator 3 is unlikely to be displaced at the part that is bonded to the first adhesive member 21 and the second adhesive member 23. Accordingly, in the vibration device 1, it is possible to suppress the occurrence of displacement in the end portion of the piezoelectric element 13 by disposing the end portion of the piezoelectric element 13 so as to overlap the first adhesive member 21 and the second adhesive member 23. As a result, in the vibration device 1, it is possible to suppress peeling of the end portion of the piezoelectric element 13 (piezoelectric element body 17) from the diaphragm 15 and the occurrence of cracks in the end portion of the piezoelectric element 13. Accordingly, it is possible to suppress a decline in reliability in the vibration device 1.

In the vibration device 1 according to the present embodiment, the bonding region of the diaphragm 15 and the first and second adhesive members 21 and 23 is larger than the region where the piezoelectric element 13 and the first and second adhesive members 21 and 23 overlap when viewed from the first direction D1. In this configuration, the bonding region of the diaphragm 15 and the first and second adhesive members 21 and 23 becomes large, and thus bonding strength can be ensured between the diaphragm 15 and the first and second adhesive members 21 and 23. Accordingly, in the vibration device 1, it is possible to suppress the occurrence of inconvenience such as peeling of the diaphragm 15 and the first and second adhesive members 21 and 23. Accordingly, it is possible to suppress a decline in reliability in the vibration device 1.

In the vibration device 1 according to the present embodiment, the piezoelectric element 13 has a rectangular shape when viewed from the first direction D1. The piezoelectric element 13 (piezoelectric element body 17) and the diaphragm 15 are disposed so as to have following long and short sides. In the end portion of the piezoelectric element 13, a part that is ½ or more of the length of the short side of the piezoelectric element 13 along the pair of short sides of the diaphragm 15 overlaps the first adhesive member 21 and the second adhesive member 23. In this configuration, it is possible to further suppress the occurrence of displacement in the end portion of the piezoelectric element 13 (piezoelectric element body 17). As a result, in the vibration device 1, it is possible to further suppress peeling of the end portion of the piezoelectric element 13 from the diaphragm 15 and the occurrence of cracks in the end portion of the piezoelectric element 13.

Second Embodiment

Next, a second embodiment will be described. As illustrated in FIGS. 5 to 8, a vibration device 1A according to the second embodiment includes the piezoelectric vibrator 3, the vibration member 5, an adhesive member 7A, and the wiring member 11.

The adhesive member 7A includes a first adhesive member 21A and a second adhesive member 23A.

The first adhesive member 21A has a pair of main surfaces 21Aa and 21Ab facing each other. An adhesive layer (not illustrated) is provided on the main surfaces 21Aa and 21Ab. Each of the main surfaces 21Aa and 21Ab has a pair of long sides and a pair of short sides. Each of the main surfaces 21Aa and 21Ab has a rectangular shape having a pair of long sides and a pair of short sides. In other words, the first adhesive member 21A has a rectangular shape having a pair of long sides and a pair of short sides in plan view. In the present embodiment, the long side direction of the main surfaces 21Aa and 21Ab coincides with the third direction D3. The short side direction of the main surfaces 21Aa and 21Ab coincides with the second direction D2 direction. Each of the entire main surface 21Aa and the entire main surface 21Ab is an adhesive surface. In other words, the adhesive surface of the first adhesive member 21A has a rectangular shape.

The length of the long side of each of the main surfaces 21Aa and 21Ab is equal to the length of the long side of each of the main surfaces 15a and 15b of the diaphragm 15. The length of the short side of each of the main surfaces 21Aa and 21Ab is, for example, ¼ or less of the length of the short side of each of the main surfaces 15a and 15b of the diaphragm 15. The first adhesive member 21A has a predetermined thickness (length in the facing direction of the pair of main surfaces 21Aa and 21Ab, for example, approximately 0.5 mm).

The second adhesive member 23A has a pair of main surfaces 23Aa and 23Ab facing each other. Each of the main surfaces 23Aa and 23Ab has a pair of long sides and a pair of short sides. Each of the main surfaces 23Aa and 23Ab has a rectangular shape having a pair of long sides and a pair of short sides. In other words, the second adhesive member 23A has a rectangular shape having a pair of long sides and a pair of short sides in plan view. In the present embodiment, the long side direction of the main surfaces 23Aa and 23Ab coincides with the third direction D3. The short side direction of the main surfaces 23Aa and 23Ab coincides with the second direction D2 direction. Each of the entire main surface 23Aa and the entire main surface 23Ab is an adhesive surface. In other words, the adhesive surface of the second adhesive member 23A has a rectangular shape.

The length of the long side of each of the main surfaces 23Aa and 23Ab is equal to the length of the long side of each of the main surfaces 15a and 15b of the diaphragm 15. The length of the short side of each of the main surfaces 23Aa and 23Ab is, for example, ¼ or less of the length of the short side of each of the main surfaces 15a and 15b of the diaphragm 15. The second adhesive member 23A has a predetermined thickness (length in the facing direction of the pair of main surfaces 23Aa and 23Ab, for example, approximately 0.5 mm).

Each of the first adhesive member 21A and the second adhesive member 23A is disposed between the diaphragm 15 and the vibration member 5. Each of the first adhesive member 21A and the second adhesive member 23A is disposed between the main surface 15b of the diaphragm 15 and the main surface 5a of the vibration member 5. The first adhesive member 21A and the second adhesive member 23A are disposed apart from each other with a predetermined gap in the second direction D2. The first adhesive member 21A and the second adhesive member 23A are disposed so as to face each other in the second direction D2. In other words, the first adhesive member 21A and the second adhesive member 23A are disposed so as to face each other on the pair of long-side sides of each of the main surfaces 15a and 15b of the diaphragm 15. The first adhesive member 21A and the second adhesive member 23A fix the diaphragm 15 (piezoelectric vibrator 3) to the vibration member 5 on the pair of long-side sides of the main surfaces 15a and 15b of the diaphragm 15.

The first adhesive member 21A is disposed in one end portion (end portion on the upper side of FIG. 6) of the diaphragm 15 in the second direction D2. In other words, the first adhesive member 21A is disposed in the end portion on one long-side side of the piezoelectric vibrator 3. The main surface 21Aa of the first adhesive member 21A is bonded to the main surface 15b of the diaphragm 15. The main surface 21Ab of the first adhesive member 21A is bonded to the main surface 5a of the vibration member 5. The long sides of the main surfaces 21Aa and 21Ab are along the long sides of the main surfaces 15a and 15b of the diaphragm 15, and the short sides of the main surfaces 21Aa and 21Ab are along the short sides of the main surfaces 15a and 15b of the diaphragm 15. In the present embodiment, one end surface (end surface on the upper side of FIG. 6) along the long side of each of the main surfaces 21Aa and 21Ab is flush with the end surface that is along the long side of each of the main surfaces 15a and 15b of the diaphragm 15. Both end surfaces (right and left end surfaces in FIG. 6) along the short sides of the main surfaces 21Aa and 21Ab are respectively flush with both end surfaces along the short sides of the main surfaces 15a and 15b of the diaphragm 15.

The second adhesive member 23A is disposed in the other end portion (end portion on the lower side of FIG. 6) of the diaphragm 15 in the second direction D2. In other words, the second adhesive member 23A is disposed in the end portion on the other long-side side of the piezoelectric vibrator 3. The main surface 23Aa of the second adhesive member 23A is bonded to the main surface 15b of the diaphragm 15. The main surface 23Ab of the second adhesive member 23A is bonded to the main surface 5a of the vibration member 5. The long sides of the main surfaces 23Aa and 23Ab are along the long sides of the main surfaces 15a and 15b of the diaphragm 15, and the short sides of the main surfaces 23Aa and 23Ab are along the short sides of the main surfaces 15a and 15b of the diaphragm 15. In the present embodiment, the other end surface (end surface on the lower side of FIG. 6) along the long side of each of the main surfaces 23Aa and 23Ab is flush with the end surface that is along the long side of each of the main surfaces 15a and 15b of the diaphragm 15. Both end surfaces (right and left end surfaces in FIG. 6) along the short sides of the main surfaces 23Aa and 23Ab are respectively flush with both end surfaces along the short sides of the main surfaces 15a and 15b of the diaphragm 15.

Figure 6:
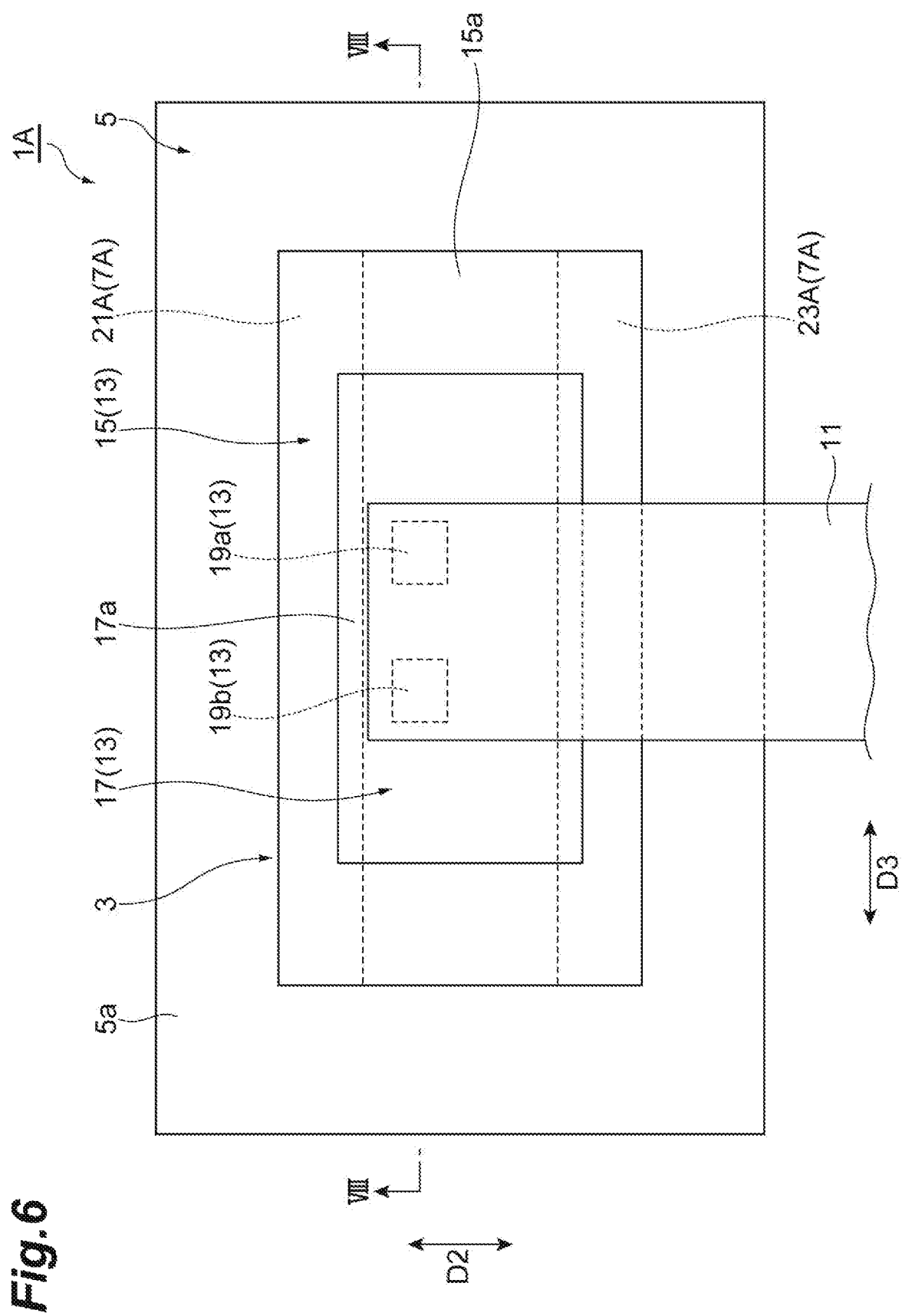
FIG. 6 is a plan view of the vibration device illustrated in FIG. 5.
Figure 7:
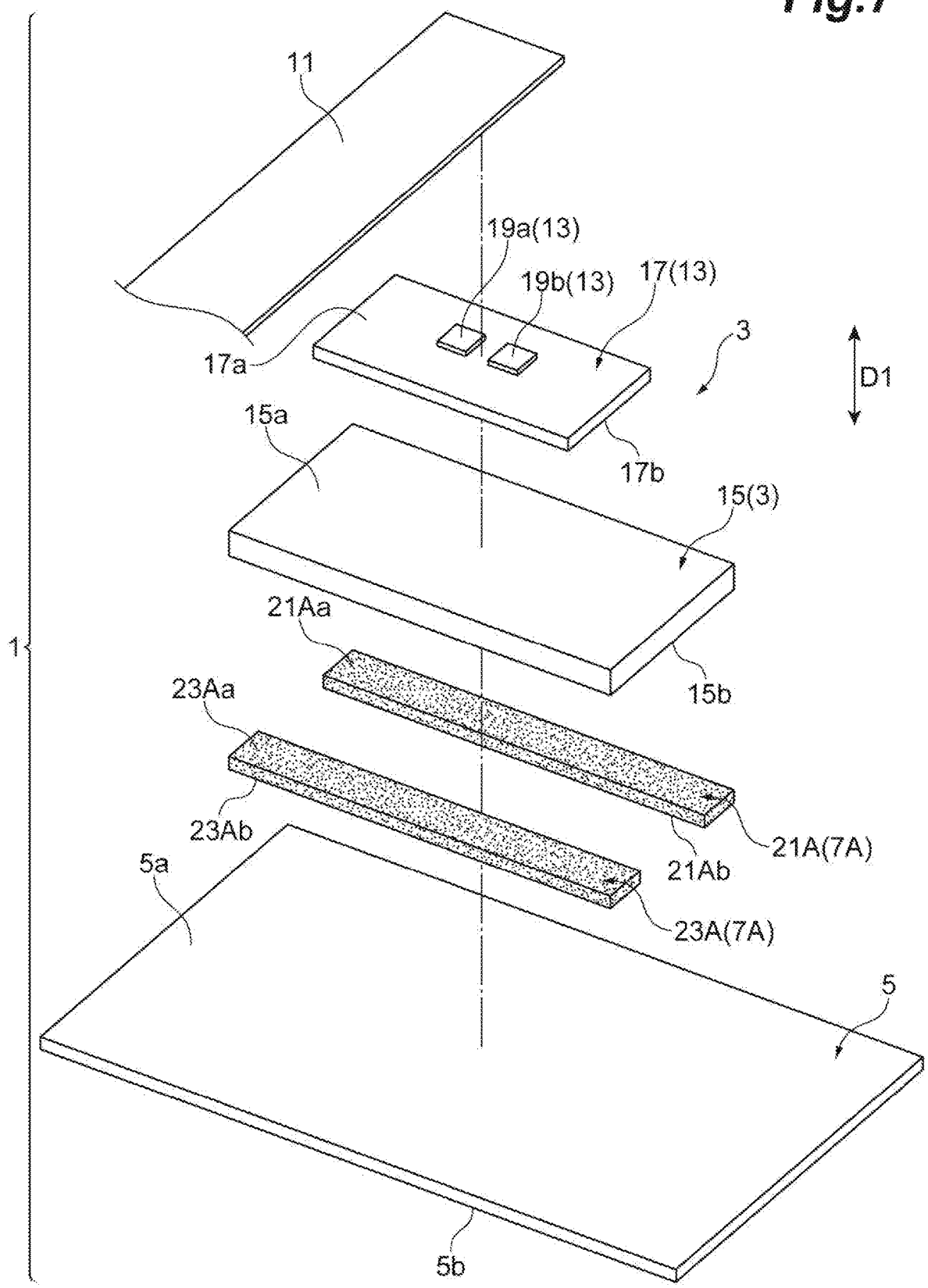
FIG. 7 is an exploded perspective view of the vibration device illustrated in FIG. 5.

As illustrated in FIG. 6, a part of the piezoelectric element 13 overlaps each of the first adhesive member 21A and the second adhesive member 23A when viewed from the first direction D1. One end portion of the piezoelectric element 13 in the second direction D2 overlaps the first adhesive member 21A. The other end portion of the piezoelectric element 13 in the second direction D2 overlaps the second adhesive member 23A. In the piezoelectric element body 17, a part that is ½ or more of the length of the pair of long sides of each of the main surfaces 17a and 17b overlaps each of the first adhesive member 21A and the second adhesive member 23A. In the present embodiment, the entire length part of the pair of long sides of each of the main surfaces 17a and 17b of the piezoelectric element body 17 overlaps each of the first adhesive member 21A and the second adhesive member 23A.

The region where the piezoelectric element 13 and the first and second adhesive members 21A and 23A overlap is smaller than the bonding region of the diaphragm 15 and the first and second adhesive members 21A and 23A. In other words, the bonding region of the diaphragm 15 and the first and second adhesive members 21A and 23A is larger than the region where the piezoelectric element 13 and the first and second adhesive members 21A and 23A overlap.

Figure 8:
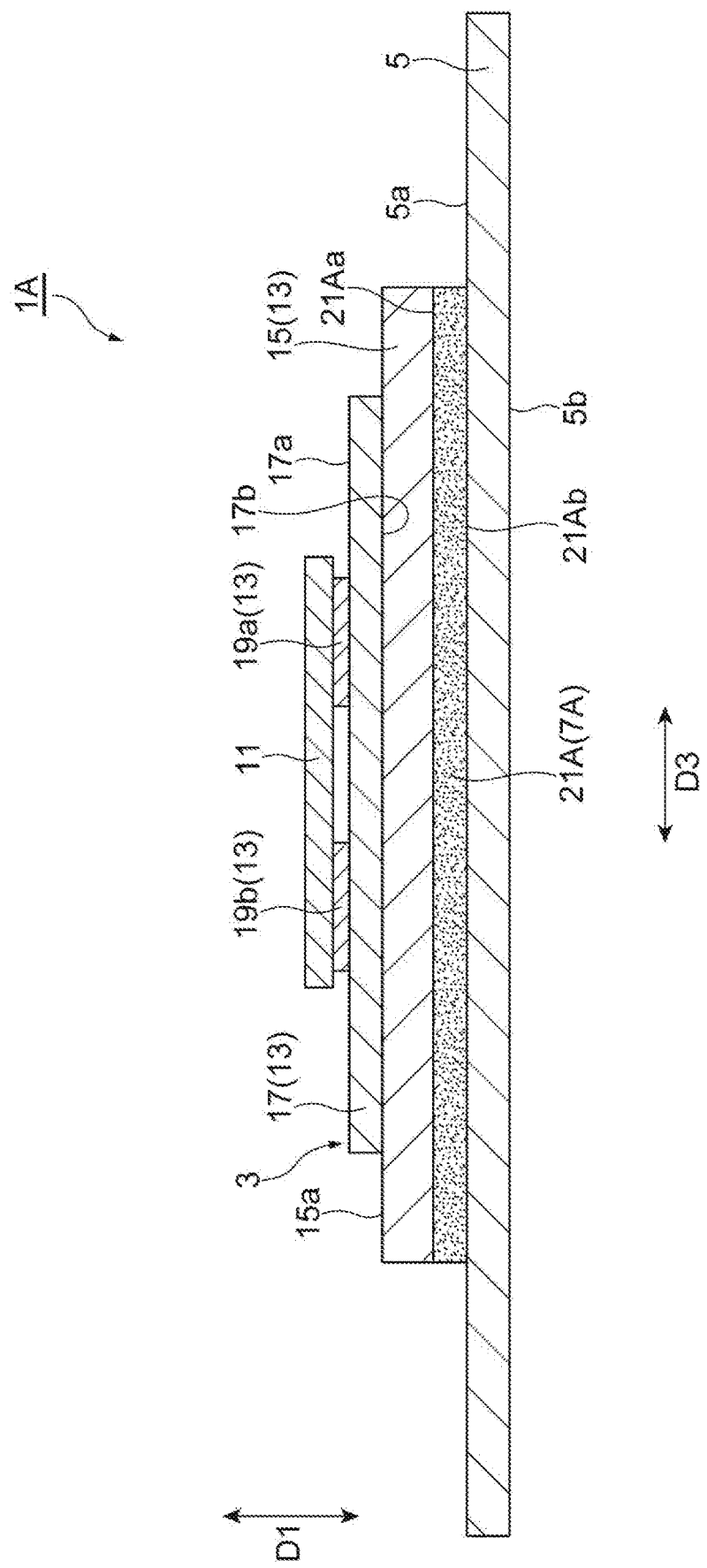
FIG. 8 is a diagram illustrating a cross-sectional configuration along the VIII-VIII line in FIG. 6.
Figure 9:
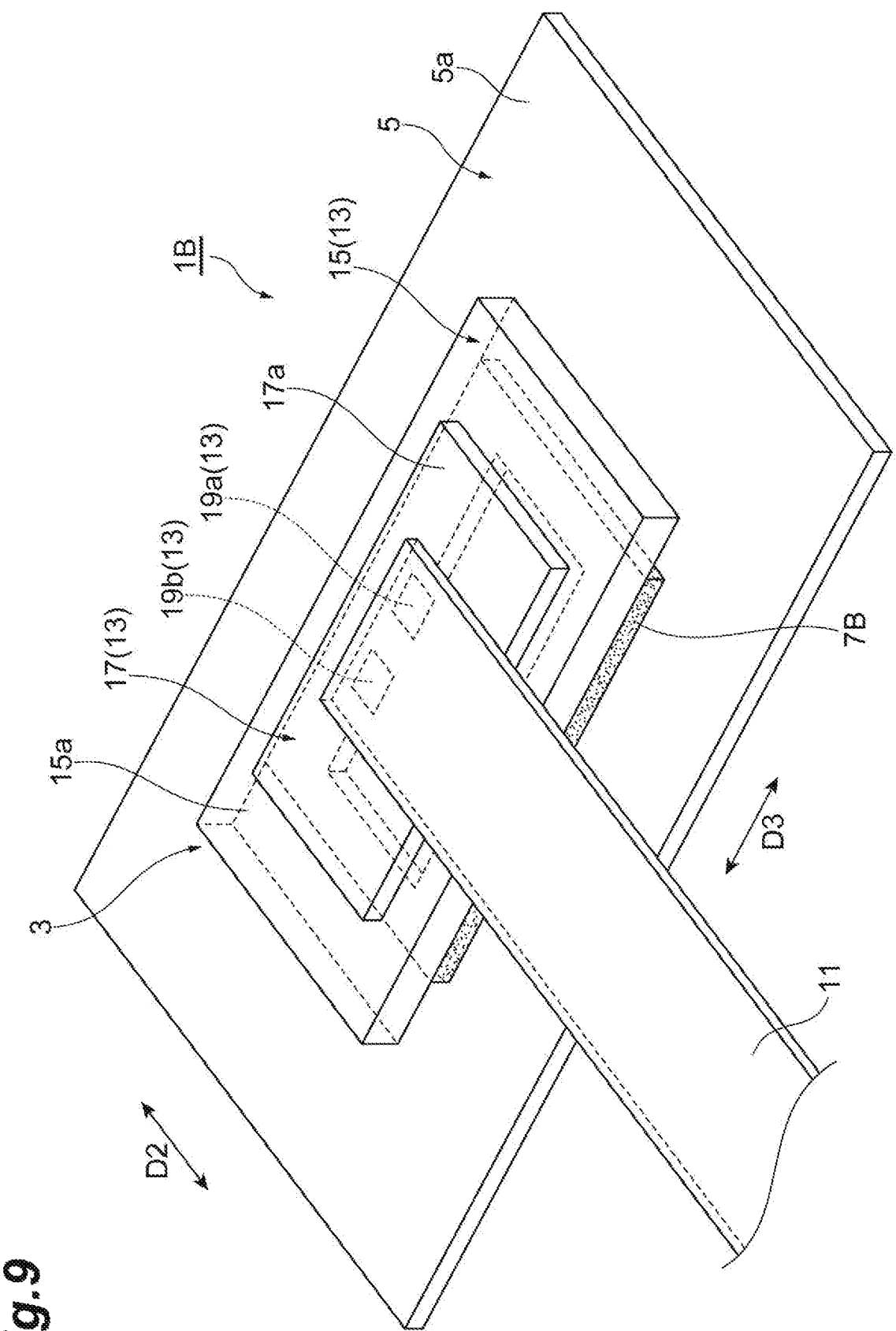
FIG. 9 is a perspective view illustrating a vibration device according to a third embodiment.

As illustrated in FIG. 8, the diaphragm 15 and the vibration member 5 are disposed apart from each other in the first direction D1 by the first adhesive member 21A and the second adhesive member 23A. In other words, a gap (space) is formed between the diaphragm 15 and the vibration member 5.

As described above, in the vibration device 1A according to the present embodiment, the first adhesive member 21A and the second adhesive member 23A are disposed so as to face each other on the long-side sides of the main surfaces 15a and 15b of the diaphragm 15. As a result, in the vibration device 1A, a space is formed between the first adhesive member 21A and the second adhesive member 23A facing each other. In other words, a gap is formed between the diaphragm 15 and the vibration member 5. Accordingly, in the vibration device 1A, it is possible to avoid the vibration member 5 hindering displacement of the piezoelectric vibrator 3. Accordingly, in the vibration device 1A, vibration of the piezoelectric vibrator 3 can be efficiently obtained.

In the vibration device 1A according to the present embodiment, the end portion of the piezoelectric element 13 in the second direction D2 overlaps each of the first adhesive member 21A and the second adhesive member 23A when viewed from the first direction D1. The piezoelectric vibrator 3 is unlikely to be displaced at the part that is bonded to the first adhesive member 21A and the second adhesive member 23A. Accordingly, in the vibration device 1A, it is possible to suppress the occurrence of displacement in the end portion of the piezoelectric element 13 by disposing the end portion of the piezoelectric element 13 so as to overlap the first adhesive member 21A and the second adhesive member 23A. As a result, in the vibration device 1A, it is possible to suppress peeling of the end portion of the piezoelectric element 13 (piezoelectric element body 17) from the diaphragm 15 and the occurrence of cracks in the end portion of the piezoelectric element 13. Accordingly, it is possible to suppress a decline in reliability in the vibration device 1A.

In the vibration device 1A according to the present embodiment, the bonding region of the diaphragm 15 and the first and second adhesive members 21A and 23A is larger than the region where the piezoelectric element 13 and the first and second adhesive members 21A and 23A overlap when viewed from the first direction D1. In this configuration, the bonding region of the diaphragm 15 and the first and second adhesive members 21A and 23A becomes large, and thus bonding strength can be ensured between the diaphragm 15 and the first and second adhesive members 21A and 23A. Accordingly, in the vibration device 1A, it is possible to suppress the occurrence of inconvenience such as peeling of the diaphragm 15 and the first and second adhesive members 21A and 23A. Accordingly, it is possible to suppress a decline in reliability in the vibration device 1A.

In the vibration device 1A according to the present embodiment, the piezoelectric element 13 has a rectangular shape when viewed from the first direction D1. The piezoelectric element 13 (piezoelectric element body 17) and the diaphragm 15 are disposed so as to have following long and short sides. In the end portion of the piezoelectric element 13, a part that is ½ or more of the length of the long side of the piezoelectric element 13 along the pair of long sides of the diaphragm 15 overlaps the first adhesive member 21A and the second adhesive member 23A. In this configuration, it is possible to further suppress the occurrence of displacement in the end portion of the piezoelectric element 13 (piezoelectric element body 17). As a result, in the vibration device 1A, it is possible to further suppress peeling of the end portion of the piezoelectric element 13 from the diaphragm 15 and the occurrence of cracks in the end portion of the piezoelectric element 13.

Third Embodiment

Next, a third embodiment will be described. As illustrated in FIGS. 9 to 12, a vibration device 1B according to the third embodiment includes the piezoelectric vibrator 3, the vibration member 5, an adhesive member 7B, and the wiring member 11.

Figure 10:
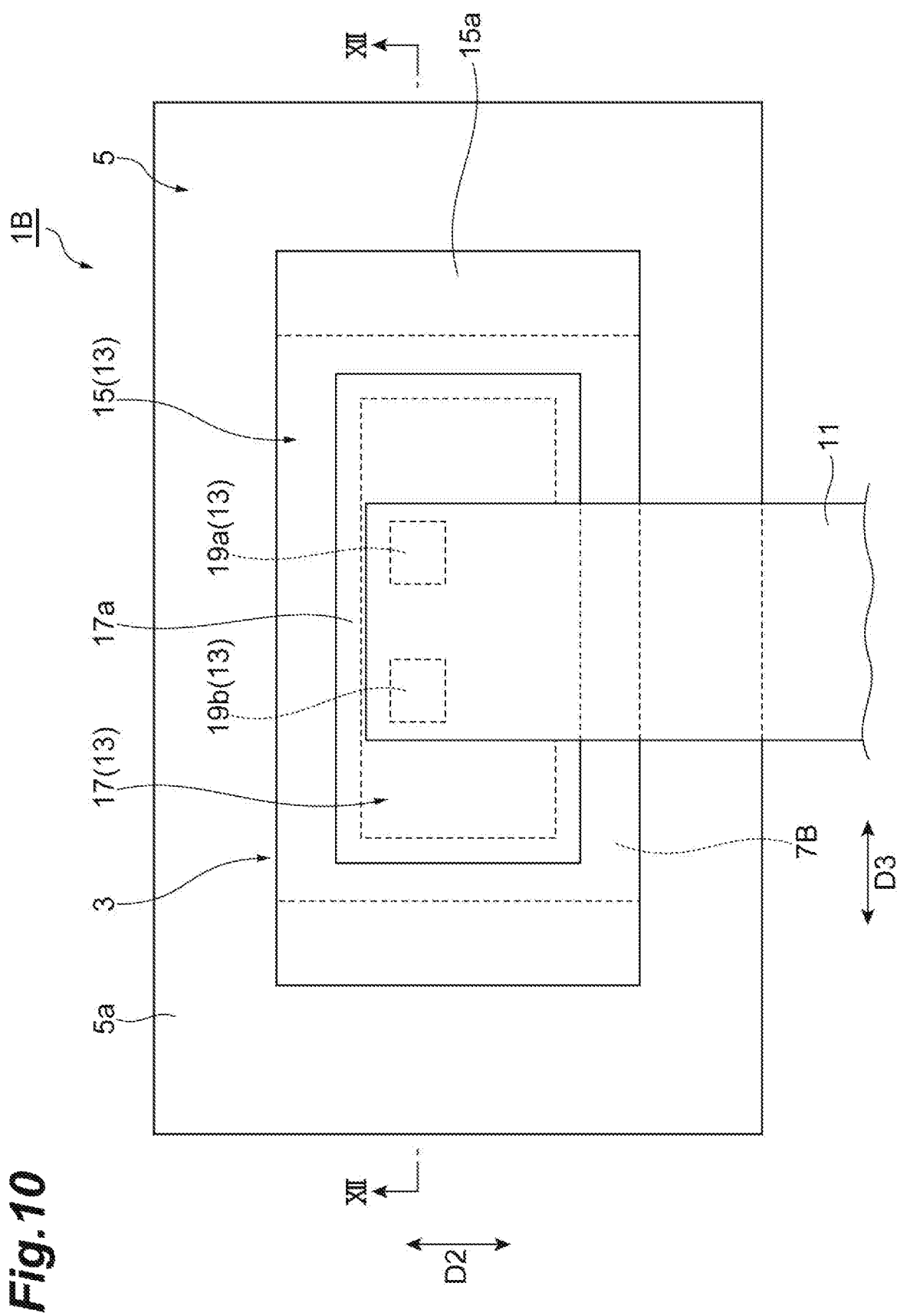
FIG. 10 is a plan view of the vibration device illustrated in FIG. 9.
Figure 11:
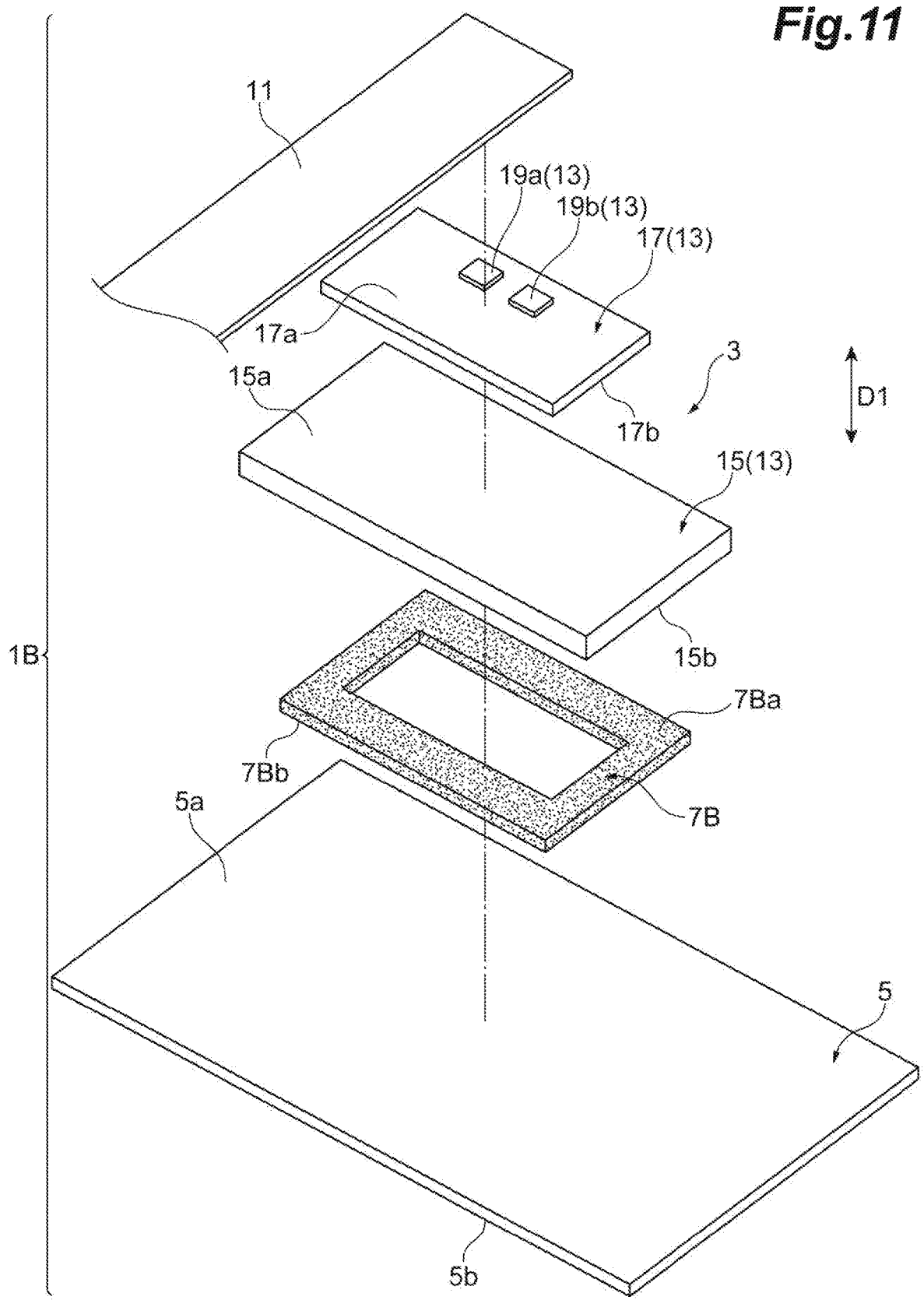
FIG. 11 is an exploded perspective view of the vibration device illustrated in FIG. 9.
Figure 12:
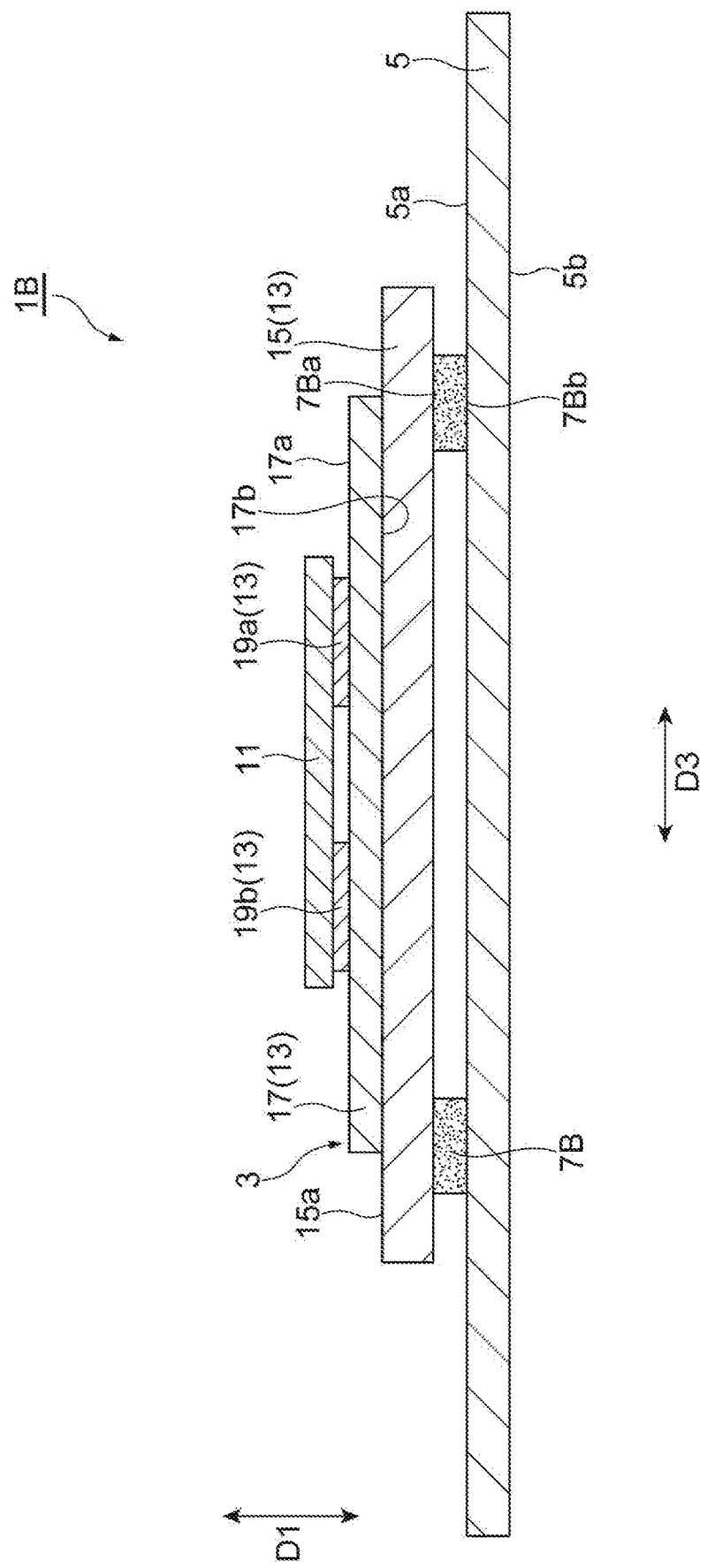
FIG. 12 is a diagram illustrating a cross-sectional configuration along the XII-XII line in FIG. 10.

As illustrated in FIGS. 10 and 11, the adhesive member 7B has a pair of main surfaces 7Ba and 7Bb facing each other. An adhesive layer (not illustrated) is provided on the main surfaces 7Ba and 7Bb. Each of the main surfaces 7Ba and 7Bb has a frame shape when viewed from the first direction D1. The outer shape of each of the main surfaces 7Ba and 7Bb has a pair of long sides and a pair of short sides. In other words, the outer shape of each of the main surfaces 7Ba and 7Bb has a rectangular shape having a pair of long sides and a pair of short sides. In the present embodiment, the long side direction of the main surfaces 7Ba and 7Bb coincides with the third direction D3. The short side direction of the main surfaces 7Ba and 7Bb coincides with the second direction D2 direction. An opening portion having a rectangular shape when viewed from the first direction D1 is formed in the adhesive member 7B. Each of the entire main surface 7Ba and the entire main surface 7Bb is an adhesive surface. In other words, the adhesive surface of the adhesive member 7B has a frame shape.

The length of the long side of each of the main surfaces 7Ba and 7Bb is shorter than the length of the long side of each of the main surfaces 15a and 15b of the diaphragm 15. The length of the short side of each of the main surfaces 7Ba and 7Bb is, for example, equal to the short side of each of the main surfaces 15a and 15b of the diaphragm 15. The adhesive member 7B has a predetermined thickness (length in the facing direction of the pair of main surfaces 7Ba and 7Bb, for example, approximately 0.5 mm).

The adhesive member 7B is disposed between the diaphragm 15 and the vibration member 5. The adhesive member 7B is disposed between the main surface 15b of the diaphragm 15 and the main surface 5a of the vibration member 5. The parts that are along the short sides of the main surfaces 7Ba and 7Bb of the adhesive member 7B are disposed apart from each other with a predetermined gap in the third direction D3. In other words, the parts that are along the short sides of the main surfaces 7Ba and 7Bb of the adhesive member 7B are disposed so as to face each other on the pair of short-side sides of the main surfaces 15a and 15b of the diaphragm 15. The parts that are along the long sides of the main surfaces 7Ba and 7Bb of the adhesive member 7B are disposed apart from each other with a predetermined gap in the second direction D2. In other words, the parts that are along the long sides of the main surfaces 7Ba and 7Bb of the adhesive member 7B are disposed so as to face each other on the pair of long-side sides of the main surfaces 15a and 15b of the diaphragm 15. The adhesive member 7B fixes the diaphragm 15 (piezoelectric vibrator 3) to the vibration member 5 on the pair of short-side sides and the pair of long-side sides of the main surfaces 15a and 15b of the diaphragm 15.

The parts that are along the short sides of the main surfaces 7Ba and 7Bb of the adhesive member 7B are respectively disposed in the end portion of the diaphragm 15 in the third direction D3 (end portion on the right or left side of FIG. 10). In other words, the parts that are along the short sides of the main surfaces 7Ba and 7Bb of the adhesive member 7B are respectively disposed in the end portion on the short-side side of the piezoelectric vibrator 3. In the present embodiment, the end surfaces of the parts along the short sides of the main surfaces 7Ba and 7Bb (end surface on the right or left side of FIG. 10) are positioned inside the end surfaces along the short sides of the main surfaces 15a and 15b of the diaphragm 15.

The parts that are along the long sides of the main surfaces 7Ba and 7Bb of the adhesive member 7B are respectively disposed in the end portion of the diaphragm 15 in the second direction D2 (end portion on the upper or lower side of FIG. 10). In other words, the parts that are along the long sides of the main surfaces 7Ba and 7Bb of the adhesive member 7B are respectively disposed in the end portion on the long-side side of the piezoelectric vibrator 3. In the present embodiment, the end surfaces of the parts along the long sides of the main surfaces 7Ba and 7Bb (end surface on the upper or lower side of FIG. 10) are flush with the end surfaces along the long sides of the main surfaces 15a and 15b of the diaphragm 15.

As illustrated in FIG. 10, a part of the piezoelectric element 13 overlaps the adhesive member 7B when viewed from the first direction D1. One end portion of the piezoelectric element 13 in the second direction D2 and the end portion of the piezoelectric element 13 in the third direction D3 overlap the adhesive member 7B. In the piezoelectric element body 17, parts that are ½ or more of the lengths of the pair of short sides and the pair of long sides of each of the main surfaces 17a and 17b overlap the adhesive member 7B. In the present embodiment, the entire length parts of the pair of short sides and the pair of long sides of each of the main surfaces 17a and 17b of the piezoelectric element body 17 respectively overlap the adhesive member 7B.

The region where the piezoelectric element 13 and the adhesive member 7B overlap is smaller than the bonding region of the diaphragm 15 and the adhesive member 7B. In other words, the area where the diaphragm 15 and the adhesive member 7B overlap is larger than the bonding region of the piezoelectric element 13 and the adhesive member 7B.

As illustrated in FIG. 11, the diaphragm 15 and the vibration member 5 are disposed apart from each other in the first direction D1 by the adhesive member 7B. In other words, a gap (space) is formed between the diaphragm 15 and the vibration member 5.

As described above, in the vibration device 1B according to the present embodiment, the adhesive member 7B is disposed in a facing manner on the short-side sides and the long-side sides of the main surfaces 15a and 15b of the diaphragm 15. As a result, in the vibration device 1B, a gap is formed between the diaphragm 15 and the vibration member 5. Accordingly, in the vibration device 1B, it is possible to avoid the vibration member 5 hindering displacement of the piezoelectric vibrator 3. Accordingly, in the vibration device 1B, vibration of the piezoelectric vibrator 3 can be efficiently obtained.

In the vibration device 1B according to the present embodiment, the end portions of the piezoelectric element 13 in the second direction D2 and the third direction D3 overlap the adhesive member 7B when viewed from the first direction D1. The piezoelectric vibrator 3 is unlikely to be displaced at the part that is bonded to the adhesive member 7B. Accordingly, in the vibration device 1B, it is possible to suppress the occurrence of displacement in the end portion of the piezoelectric element 13 by disposing the end portion of the piezoelectric element 13 so as to overlap the adhesive member 7B. As a result, in the vibration device 1B, it is possible to suppress peeling of the end portion of the piezoelectric element 13 (piezoelectric element body 17) from the diaphragm 15 and the occurrence of cracks in the end portion of the piezoelectric element 13. Accordingly, it is possible to suppress a decline in reliability in the vibration device 1B.

In the vibration device 1B according to the present embodiment, the region where the diaphragm 15 and the adhesive member 7B overlap is larger than the region where the piezoelectric element 13 and the adhesive member 7B overlap when viewed from the first direction D1. In this configuration, the bonding region of the diaphragm 15 and the adhesive member 7B becomes large, and thus bonding strength can be ensured between the diaphragm 15 and the adhesive member 7B. Accordingly, in the vibration device 1B, it is possible to suppress the occurrence of inconvenience such as peeling of the diaphragm 15 and the adhesive member 7B. Accordingly, it is possible to suppress a decline in reliability in the vibration device 1B.

In the vibration device 1B according to the present embodiment, the piezoelectric element 13 has a rectangular shape when viewed from the first direction D1. The piezoelectric element 13 (piezoelectric element body 17) and the diaphragm 15 are disposed so as to have following long and short sides. In the end portion of the piezoelectric element 13, parts that are ½ or more of the lengths of the short and long sides of the piezoelectric element 13 along the pair of short sides and the pair of long sides of the diaphragm 15 overlap the first adhesive member 21A and the second adhesive member 23A. In this configuration, it is possible to further suppress the occurrence of displacement in the end portion of the piezoelectric element 13 (piezoelectric element body 17). As a result, in the vibration device 1B, it is possible to further suppress peeling of the end portion of the piezoelectric element 13 from the diaphragm 15 and the occurrence of cracks in the end portion of the piezoelectric element 13.

Fourth Embodiment

Figure 13:
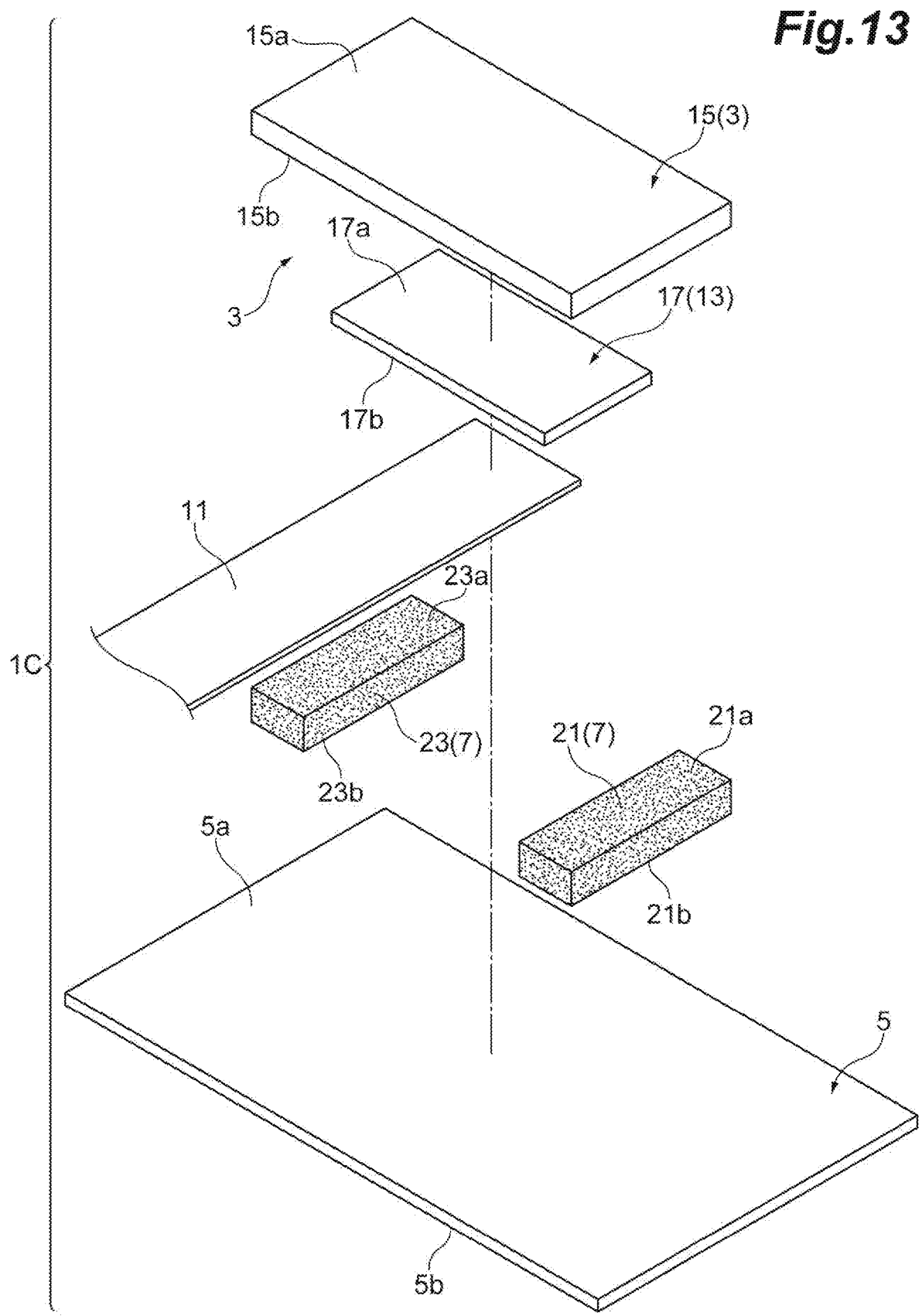
FIG. 13 is an exploded perspective view of a vibration device according to a fourth embodiment.
Figure 14:
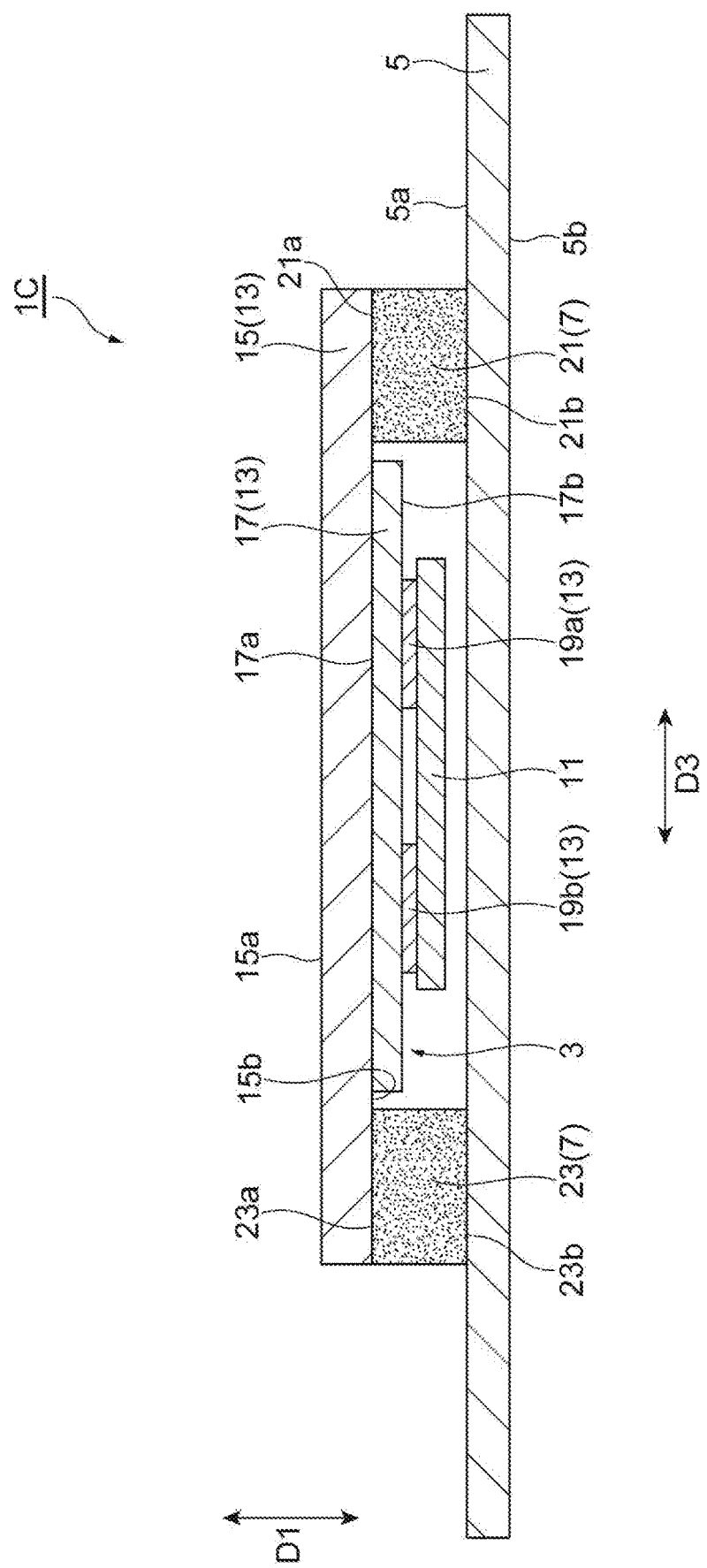
FIG. 14 is a diagram illustrating a cross-sectional configuration of the vibration device illustrated in FIG. 13.

Next, a fourth embodiment will be described. As illustrated in FIGS. 13 and 14, a vibration device 1C according to the fourth embodiment includes the piezoelectric vibrator 3, the vibration member 5, the adhesive member 7, and the wiring member 11. The adhesive member 7 of the vibration device 1C is similar in configuration to the adhesive member 7 of the first embodiment.

The piezoelectric element 13 is disposed on the diaphragm 15. The piezoelectric element 13 is disposed at the middle position of the diaphragm 15, that is, at the intermediate position in the long side direction and the short side direction of the main surfaces 15a and 15b of the diaphragm 15. The piezoelectric element 13 is disposed on the diaphragm 15 such that the center of the piezoelectric element 13 coincides with the center of the diaphragm 15 when viewed from the first direction D1. The diaphragm 15 and the piezoelectric element body 17 are disposed such that the main surface 15b and the main surface 17a face each other. In other words, the piezoelectric element 13 is disposed on the main surface 15b of the diaphragm 15. The main surface 15b of the diaphragm 15 and the main surface 17a of the piezoelectric element body 17 are bonded.

As illustrated in FIG. 14, in the vibration device 1C, the piezoelectric vibrator 3 is positioned between the first adhesive member 21 and the second adhesive member 23 facing each other in the third direction D3. The piezoelectric vibrator 3 is disposed in the gap (space) that is formed between the diaphragm 15 and the vibration member 5 by the adhesive member 7B.

As described above, in the vibration device 1C according to the present embodiment, the first adhesive member 21 and the second adhesive member 23 are disposed so as to face each other on the short-side sides of the main surfaces 15a and 15b of the diaphragm 15. As a result, in the vibration device 1C, a space is formed between the first adhesive member 21 and the second adhesive member 23 facing each other. In other words, a gap is formed between the diaphragm 15 and the vibration member 5. Accordingly, in the vibration device 1C, it is possible to avoid the vibration member 5 hindering displacement of the piezoelectric vibrator 3. Accordingly, in the vibration device 1C, vibration of the piezoelectric vibrator 3 can be efficiently obtained.

A form in which the first adhesive member 21 and the second adhesive member 23 are disposed so as to face each other on the short-side sides of the main surfaces 15a and 15b of the diaphragm 15 in the vibration device 1C has been described as an example. However, the first adhesive member 21 and the second adhesive member 23 may also be disposed so as to face each other on the long-side sides of the main surfaces 15a and 15b of the diaphragm 15 as illustrated in FIG. 6.

As illustrated in FIG. 15, a vibration device 1D may include a weight (load member) 20. The weight 20 is disposed on the diaphragm 15. The weight 20 is disposed on the main surface 15a of the diaphragm 15 (main surface on the side that is opposite to the main surface 15b where the piezoelectric element 13 is disposed). The weight 20 is a member that applies a load to the diaphragm 15 in the first direction D1.

The weight 20 is, for example, a plate-shaped member. The weight 20 has, for example, a rectangular shape when viewed from the first direction D1. The weight 20 is made of, for example, metal. The weight 20 applies a load to the diaphragm 15 in the first direction D1. The thickness of the weight 20 (length in the first direction D1) is appropriately set. For example, the thickness of the weight 20 may be larger than the thicknesses of the first adhesive member 21 and the second adhesive member 23.

The vibration device 1D includes the weight 20. When the piezoelectric element 13 is driven in this configuration, the energy for moving the center of gravity of the piezoelectric vibrator 3 can be increased by the weight 20 (excitation can be performed), and thus vibration of the piezoelectric vibrator 3 can be amplified. Accordingly, vibration can be effectively obtained in the vibration device 1D.

Although embodiments of the present invention have been described above, the present invention is not necessarily limited to the above-described embodiments and various modifications can be made without departing from the scope of the present invention.

In the embodiment described above, a form in which the piezoelectric element body 17 has a rectangular shape when viewed from the first direction D1 has been described as an example. However, the shape of the piezoelectric element is not limited thereto.

In the embodiments described above, a form in which the adhesive members 7, 7A, and 7B are double-sided tapes has been described as an example. However, the adhesive member may be another member.

REFERENCE SIGNS LIST 1, 1A to 1D: vibration device, 3: piezoelectric vibrator, 5: vibration member, 7, 7A, 7B: adhesive member, 13: piezoelectric element, 15: diaphragm, 15a, 15b: main surface, 20: weight (load member), 21, 21A: first adhesive member, 23, 23A: second adhesive member.

The invention claimed is:
1. A vibration device comprising:
a piezoelectric vibrator having (1) a piezoelectric element and (2) a diaphragm having a pair of main surfaces that are opposite faces of the diaphragm, the piezoelectric element being bonded to one of the pair of main surfaces;
a vibration member supporting the piezoelectric vibrator; and
an adhesive member between the diaphragm and the vibration member and bonding the diaphragm and the vibration member, wherein
each of the pair of main surfaces of the diaphragm has a rectangular shape when viewed from a facing direction of the pair of main surfaces, and
the adhesive member includes spaced portions on at least a pair of sides of the one of the pair of main surfaces such that an entirety of the one of the pair of main surfaces is not bonded to the vibration member by the adhesive member.
2. The vibration device according to claim 1, wherein end portions of the piezoelectric element on the pair of sides overlap the adhesive member when viewed from the facing direction.
3. The vibration device according to claim 2, wherein a bonding region where the diaphragm and the adhesive member are bonded is larger than a region where the end portions of the piezoelectric element and the adhesive member overlap when viewed from the facing direction.
4. The vibration device according to claim 2, wherein
the piezoelectric element has a rectangular shape when viewed from the facing direction,
the piezoelectric element and the diaphragm have following long and short sides, and
a part that is ½ or more of a length of a side of the piezoelectric element along the pair of sides overlaps the adhesive member in the end portions of the piezoelectric element.
5. The vibration device according to claim 1, comprising a load member on another of the pair of main surfaces of the diaphragm opposite to the one of the pair of main surfaces to which the piezoelectric element is bonded.

* * * * *